(12) United States Patent
Martin (10) Patent No.: US 8,731,042 B2
(45) Date of Patent: May 20, 2014

(54) GENERATING PULSE WIDTH MODULATED SIGNALS

(75) Inventor: Bradley Martin, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 119 days.

(21) Appl. No.: 13/404,539

(22) Filed: Feb. 24, 2012

(65) Prior Publication Data

US 2013/0223507 A1 Aug. 29, 2013

(51) Int. Cl.
*H03K 9/08* (2006.01)

(52) U.S. Cl.
USPC ........................................... 375/238

(58) Field of Classification Search
USPC .......... 375/238, 239, 259, 340; 342/200, 201; 327/231; 318/139, 400.25, 496
See application file for complete search history.

(56) References Cited

U.S. PATENT DOCUMENTS

2011/0084752 A1* 4/2011 Julstrom et al. .............. 327/336
2013/0015798 A1* 1/2013 Wright ..................... 318/400.25

* cited by examiner

*Primary Examiner* — Khai Tran
(74) *Attorney, Agent, or Firm* — Trop, Pruner & Hu, P.C.

(57) ABSTRACT

A technique includes using a first signal that is produced by a counter to generate a center-aligned pulse width modulation signal having a first time profile and using the first signal to concurrently generate a pulse width modulation signal that has a second time profile that is different from the first time profile.

19 Claims, 8 Drawing Sheets

GENERATING PULSE WIDTH MODULATED SIGNALS

BACKGROUND

Pulse width modulation (PWM) may be used in a number of applications, such as motor control and switching regulator control applications, as just a few examples. A PWM signal typically is a periodic signal, which has two time segments in each period: an on time interval (called the "on time") in which the PWM signal has a first state, or level (a logic one level, for example); and an off time interval (called the "off time") in which the PWM signal has a second level (a logic zero level, for example). By regulating a ratio (called the "duty cycle") of the duration of the on time to the period, the average, or DC, level of the PWM signal may be controlled for purposes of controlling an end device that responds to the PWM signal. For example, the duty cycle of a PWM signal may be regulated for purposes of controlling the speed of a DC motor.

For purposes of controlling more complex end devices, such as an AC synchronous electrical motor, a set of PWM signals (one for each winding of the motor, for example) may be employed. Depending on the application, the set of PWM signals may be edge-aligned or center-aligned PWM signals, a distinction based on the timing of the PWM signals relative to each other. For edge-aligned PWM signals, either on or off time boundaries of the PWM signals are aligned in time. For example, a set of edge-aligned PWM signals may have the beginnings of the respective off times aligned, although the duty cycles may vary among the PWM signals. For center-aligned PWM signals, either the on or off times of the PWM signals are symmetrical. For example, a set of center-aligned PWM signals may have the center points of their on times aligned, although the duty cycles may vary among the PWM signals.

SUMMARY

In an exemplary embodiment, a technique includes using a first signal that is produced by a counter to generate a center-aligned pulse width modulation signal having a first time profile and using the first signal to concurrently generate a pulse width modulation signal that has a second time profile that is different from the first time profile.

In another exemplary embodiment, an apparatus includes a counter, a first waveform generator and a second waveform generator. The counter is adapted to generate a first signal. The first waveform generator is adapted to use the first signal to generate a center aligned pulse width modulation signal having a first time profile, and the second waveform generator is adapted to use the first signal to concurrently generate a pulse width modulation signal having a second time profile that is different from the first time profile.

In yet another exemplary embodiment, an apparatus includes an integrated circuit that includes a programmable counter array and a processor that is adapted to program the programmable counter array. The programmable counter array includes a counter, a first waveform generator and a second waveform generator. The counter is adapted to generate a first signal. The first waveform generator is adapted to use the first signal to generate a center aligned pulse width modulation signal having a first time profile, and the second waveform generator is adapted to use the first signal to concurrently generate a pulse width modulation signal having a second time profile that is different from the first time profile.

Advantages and other desired features will become apparent from the following drawings, description and claims.

DETAILED DESCRIPTION

Figure 1:
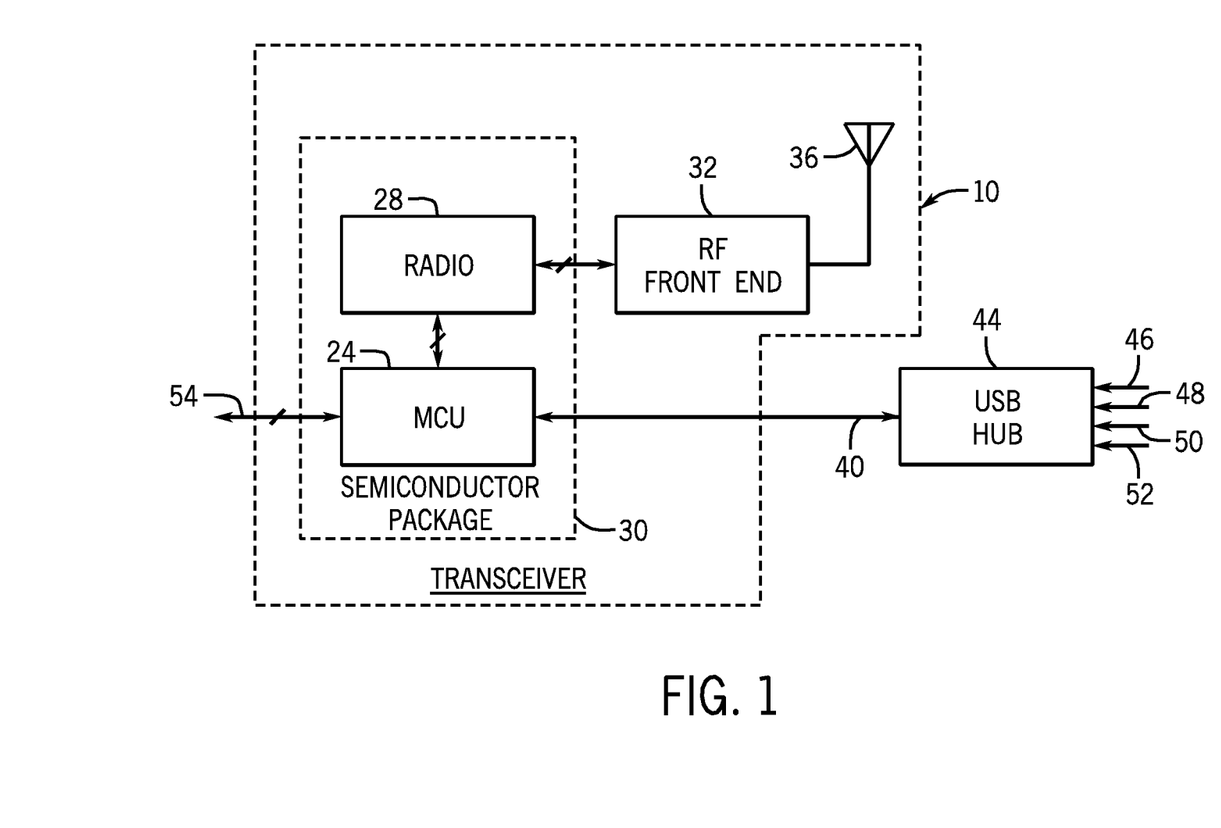
FIG. 1 is a schematic diagram of a transceiver system according to an exemplary embodiment.

Referring to FIG. 1, in accordance with some embodiments that are disclosed herein, an embedded microcontroller unit (MCU) 24 may be used in a variety of applications, such as applications in which the MCU 24 controls various aspects of a transceiver 10 (as a non-limiting example). In this regard, the MCU 24, for this particular example, may be part of an integrated circuit (IC), or semiconductor package 30, which also includes a radio 28. As a non-limiting example, the MCU 24 and the radio 28 may collectively form a packet radio, which processes incoming and outgoing streams of packet data. To this end, the transceiver 10 may further include a radio frequency (RF) front end 32 and an antenna 36, which receives and transmits RF signals (frequency modulated (FM) signals, for example) that are modulated with the packet data.

As non-limiting examples, the transceiver 10 may be used in a variety of applications that involve communicating packet stream data over relatively low power RF links and as such, may be used in wireless point of sale devices, imaging devices, computer peripherals, cellular telephone devices, etc. As a specific non-limiting example, the transceiver 10 may be employed in a smart power meter which, through a low power RF link, communicates data indicative of power consumed by a particular load (a residential load, for example) to a network that is connected to a utility. In this manner, the transceiver 10 may transmit packet data indicative of power consumed by the load to mobile meter readers as well as to an RF-to-cellular bridge, for example. Besides transmitting data, the transceiver 10 may also receive data from the utility or meter reader for such purposes (as non-limiting examples) as inquiring as to the status of various power consuming devices or equipment; controlling functions of the smart power meter; communicating a message to a person associated with the monitored load, etc.

As depicted in FIG. 1, in addition to communicating with the radio 28, the MCU 24 may further communicate with other devices and in this regard may, as examples, communicate over communication lines 54 with a current monitoring and/or voltage monitoring device of the smart power meter as well as communicate with devices over a serial bus 40. In this manner, the serial bus 40 may include data lines that communicate clocked data signals, and the data may be communicated over the serial bus 40 data in non-uniform bursts. As a non-limiting example, the serial bus may be a Universal Serial Bus (USB) 40, in accordance with some embodiments. As described herein, in addition to containing lines to communicate data, the serial bus, such as the USB 40, may further include a power line (a 5 volt power line, for example) for purposes of providing power to serial bus devices, such as the MCU 24. Various USB links 46, 48, 50 and 52 may communicate via a hub 44 with USB 40 and with the transceiver 10 for such purposes as communicating with a residential computer regarding power usage of various appliances, communicating with these appliances to determine their power usages, communicating with the appliances to regulate their power usages, etc.

Figure 2:
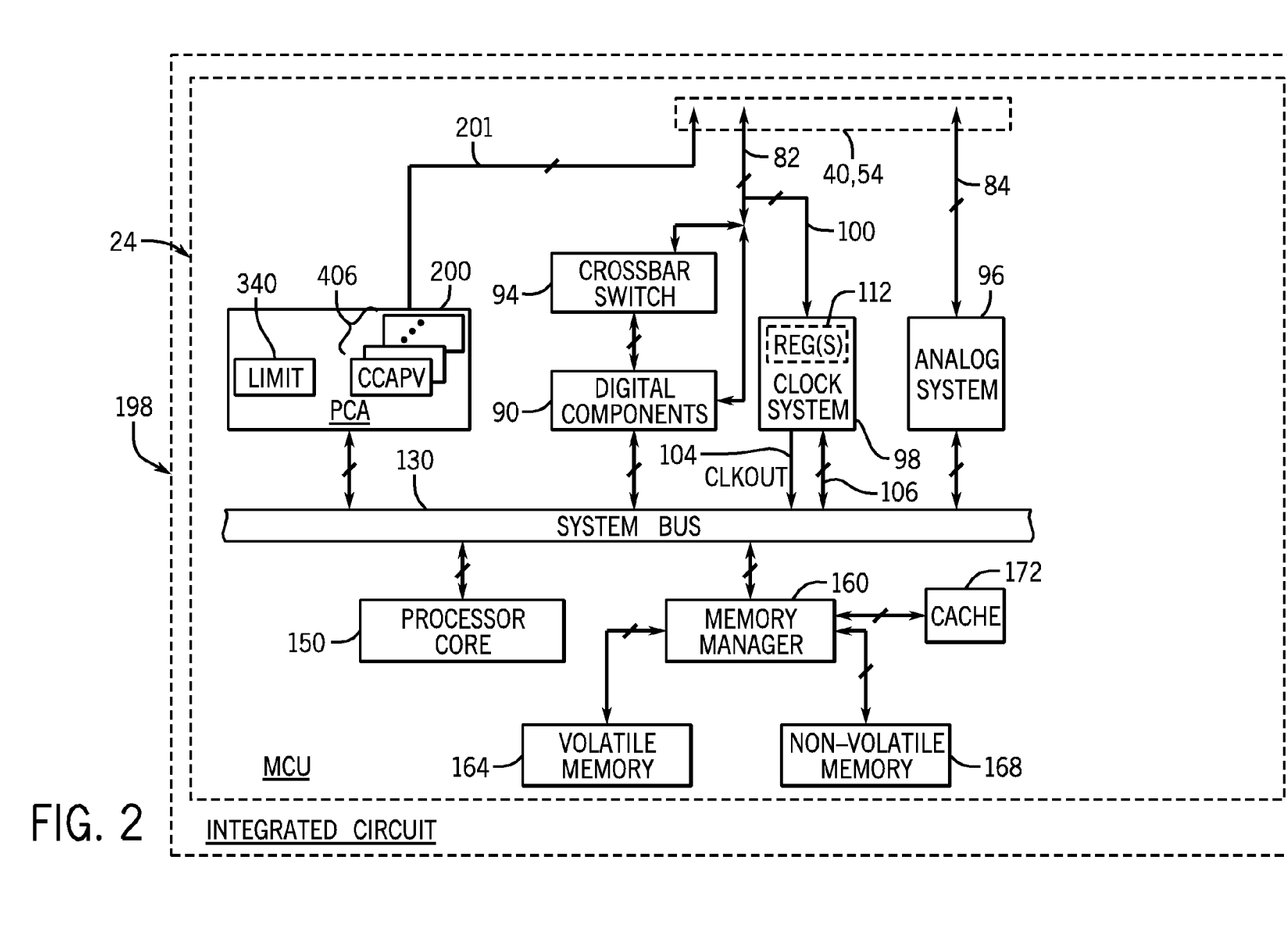
FIG. 2 is a schematic diagram of a microcontroller unit of the system of FIG. 1 according to an exemplary embodiment.

Referring to FIG. 2, in accordance with some embodiments, all or part of the components of the MCU 24 may be part of an integrated circuit 198. For example, all or part of the components of the MCU 24 may be fabricated on a single die or on multiple dies (a multi-chip module, for example) of a semiconductor package (the semiconductor package 30, for example, or another semiconductor package, as another example).

Among its components, the MCU 24 includes a processor core 150. Depending on the particular embodiment, the MCU 24 may not contain any of the components depicted in FIG. 2 other than the processor core 150; may contain one or more of the components that are depicted in FIG. 2 in addition to the processor core 150; may contain other and/or additional components than the components that are depicted in FIG. 2; and so forth. Thus, many embodiments are contemplated, which are within the scope of the appended claims. As a non-limiting example, the processor core 150 may be a 32-bit core, such as the Advanced RISC Machine (ARM) processor core, which executes a Reduced Instruction Set Computer (RISC) instruction set. In general, the processor core 150 communicates with various other system components of the MCU 24, such as a memory controller, or manager 160, over a system bus 130. In general, the memory manager 160 controls access to various memory components of the MCU 24, such as a cache 172, a non-volatile memory 168 (a Flash memory, for example) and a volatile memory 164 (a static random access memory (SRAM), for example).

For purposes of producing clock signals for use by the components of the MCU 24, such as the processor core 150, the MCU 24 includes a clock system 98. In some embodiments, the clock system 98 recovers a clock signal used in the communication of bursty data on data lines over the USB 40 and may use this recovered clock signal as the system clock signal. In accordance with exemplary embodiments disclosed herein, the clock system 98 provides a clock signal (called "CLKOUT" in FIG. 2) signal on a clock communication line 104, which is received by a corresponding clock input terminal of the processor core 150. As described further herein, the clock system 98 selects (based on data written to one or more registers 112) one of a plurality of different frequency clock signals to be the CLKOUT signal for purposes of clocking the processor core 150, depending on the power consumption state of the processor core 150.

As non-limiting examples, the clock signals available for the clock system's selection includes a relatively low frequency clock signal that may be provided by a real time clock (RTC) oscillator of the MCU 24 (as a non-limiting example), a higher frequency clock signal that may be provided by an internal trimmable oscillator of the MCU 24 (as another non limiting example), a yet higher frequency clock signal that is provided by a boot-up oscillator of the MCU (as another non-limiting example), and so forth. The particular clock signal that is used for purposes of clocking the processor core 150 may be based on the current power consumption state of the processor core 150.

In accordance with some embodiments, the MCU 24 includes an analog system 96, which communicates analog signals on external analog terminals 84 of the MCU 24 and generally forms the MCU's analog interface. As an example, the analog system 96 may include various components that receive analog signals, such as analog-to-digital converters (ADCs), comparators, etc.; and the analog system 96 may include components (supply regulators) that furnish analog signals (power supply voltages, for example) to the terminals 84, as well as other analog components, such as current drivers.

The MCU 24 includes various digital components 90 that communicate with the processor core 150. As non-limiting examples, the peripherals 100 may include a USB interface, a universal asynchronous receiver/transmitter (UART), a system management bus (SMB) interface, a serial peripheral (SPI) interface, and so forth. The MCU unit 24 may include a crossbar switch 94, which permits the programmable assigning of the digital peripheral components 90 to digital output terminals 82 of the MCU 24. In this regard, the MCU 24 may be selectively configured to selectively assign certain output terminals 82 to the digital peripheral components 90. The MCU 24 includes another programmable digital component, a programmable counter array (PCA) 200, which includes input/output (I/O) communication lines 201 that are coupled to external pads and internal pads of the MCU 24. The communication lines 201 may be selectively routed to output terminals of the MCU 24 via the crossbar switch 94, in accordance with some embodiments.

In accordance with exemplary embodiments, the PCA 200 includes multiple (six, as a non-limiting example) channels, which may be used for purposes of generating various waveforms for internal components of the MCU 24 and devices that are external to the MCU 24, as well as for purposes of capturing/analyzing internal and external signals. In accordance with a non-limiting example, each channel of the PCA 200 may be programmed, or configured (via write operations by the processor core 150 over the system bus 130, for example), to operate independently of the other channels in one of six modes of operation: an edge-aligned pulse width modulation (PWM) mode in which the channel generates an edge-aligned PWM signal; a center-aligned PWM mode in which the channel generates a center-aligned PWM signal; a square wave mode in which the channel generates a square wave; a timer/capture mode; an n-bit edge-aligned PWM mode; and a software timer mode. Moreover, depending on the particular embodiment, the PCA 200 may provide either a single signal or a pair of differential signals for a given channel. Thus, many variations are contemplated, which are within the scope of the appended claims.

Figure 3:
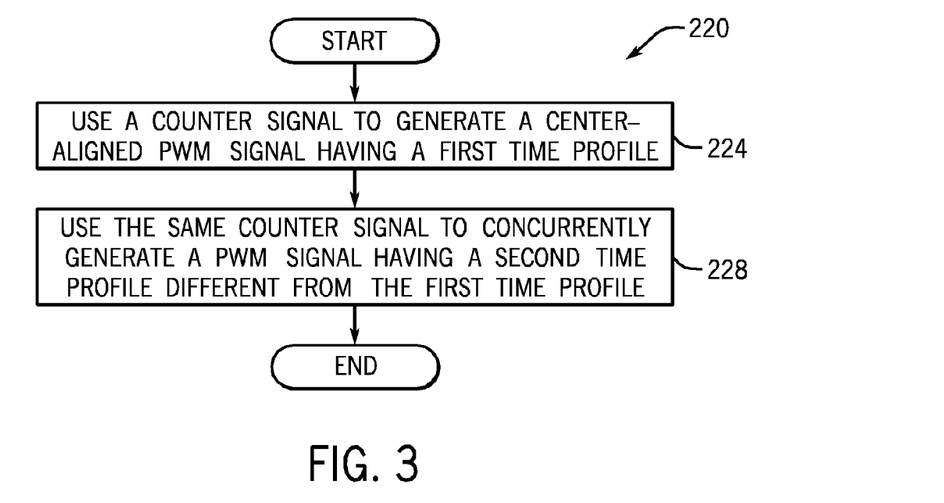
FIG. 3 is a flow diagram depicting a technique to generate a center-aligned pulse width modulation signal according to an exemplary embodiment.

As further described below, although the channels of the PCA 200 may be independently programmed to operate in one of the above-mentioned modes of operation, the channels use a common timer, or counter, of the PCA 200, which establishes the waveform cycle time of the PCA 200. More specifically, referring to FIG. 3 in conjunction with FIG. 2, in accordance with an exemplary embodiment, a technique 220 employed by the PCA 200 includes using (block 224) a counter signal to generate a center-aligned PWM signal that has a first time profile and using (block 228) the same counter signal to concurrently generate another PWM signal (another center-aligned PWM signal, for example), which has a second time profile that is different from the first time profile.

Figure 4:
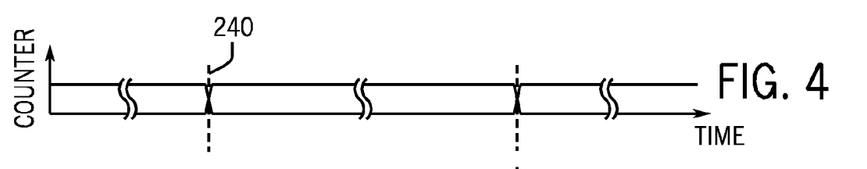
FIGS. 4-7 depict exemplary center-aligned pulse width modulation signals according to exemplary embodiments.
Figure 5:
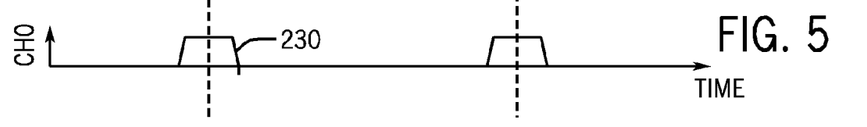
Figure 6:
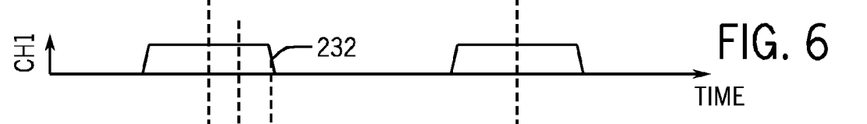
Figure 7:
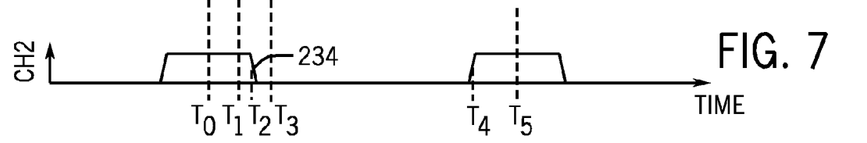
Figure 8:
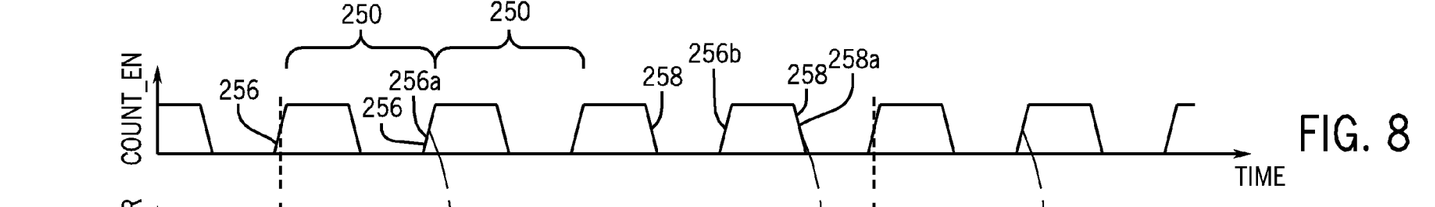
FIGS. 8-12 depict exemplary signals of the programmable counter array of FIG. 2 to generate a center-aligned pulse width modulation signal according to exemplary embodiments.

FIGS. 4-7 illustrate waveforms employed by the PCA 200 for an example embodiment in which three channels (depicted by exemplary channel signals CH0, CH1 and CH2 of FIGS. 5, 6 and 7, respectively) concurrently generate center-aligned PWM signals in response to a counter signal called "COUNTER" (see FIG. 4). For this example, the CH0, CH1 and CH2 signals have on time pulses 230, 232 and 234, respectively, which are associated with a logic one voltage level, as compared to the off times of the signals, which are associated with a logic zero voltage level. The logic levels for the on and off time pulses may be juxtaposed, in accordance with other exemplary embodiments. As depicted in FIGS. 5, 6 and 7, the on time pulses 230, 232 and 234 are generally symmetrical about time $T_0$ (for one waveform cycle) and time $T_5$ (for another waveform cycle).

Although, as further disclosed herein, the duty cycles, and thus, the on times, of the CH0, CH1 and CH2 signals are programmable and may vary, the PCA 200 generates the signals using the single COUNTER signal. More specifically, the COUNTER signal indicates a count value of an incrementing counter (or "up counter") that cycles (for each waveform cycle) between first and second values. In this manner, the initialization of the COUNTER signal to the first value (such as at time $T_0$, for example) begins a given cycle for each of the channels. When the counter reaches the second value, the current cycle terminates, and the counter transitions back to the first value to initiate another cycle.

As a more specific example, in accordance with an exemplary embodiment, the PCA 200 uses an incrementing counter, which is initialized with a zero count value to begin a given cycle and counts upwardly (as reflected by the COUNTER signal) until the count value reaches an upper limit, which causes the end of the respective cycle and the beginning of the next cycle. The duration of the cycle (which is shared in common by the channels) as well as the duty cycles of the channels are selectable via programmable settings of the PCA 200, as further described below.

Referring back to FIG. 2, in this manner, the PCA 200 includes various programmable registers to control the operations of its channels, including a programmable register 340 that may be programmed via a write operation over the system bus 130 to write data into the register 340, which indicates a value called "LIMIT." The LIMIT value, in turn, specifies the duration of the waveform cycle for the PCA 200. The PCA 200 further includes registers 406, which are programmable via write operations over the system bus 130 for purposes of storing data indicative of values, called "CCAPV values" herein. In accordance with an exemplary embodiment, each register 406 is associated with a different channel of the PCA 200 and stores a CCAPV value, which specifies the on time for the channel. Thus, the LIMIT value is common for all of the channels and establishes the common waveform cycle time; and the CCAPV values establish respective on times for the channels that generate PWM waveforms.

For a channel that is configured to generate a center-aligned PWM signal, the CCAPV and LIMIT values control when the on time pulse that began in the previous cycle ends and when the successive on time pulse begins. As a more specific example, in accordance with some embodiments, the end time of a particular on time pulse, such as time $T_2$ for the on time pulse 234 of FIG. 7, may be described as follows:

$$\text{End Time} = \frac{CCAPV}{2}. \quad \text{Eq. 1}$$

The beginning time for the successive on pulse, such as the beginning time $T_4$, for the example depicted in FIG. 7, may be described as follows:

$$\text{Beginning Time} = \text{Limit} - \frac{CCAPV}{2}. \quad \text{Eq. 2}$$

The duty cycle for a given center-aligned PWM cycle may be described as follows:

$$\text{Duty cycle} = \frac{(\text{Limit} \times 2) - CCAPV}{\text{Limit} \times 2}. \quad \text{Eq. 3}$$

Figure 9:
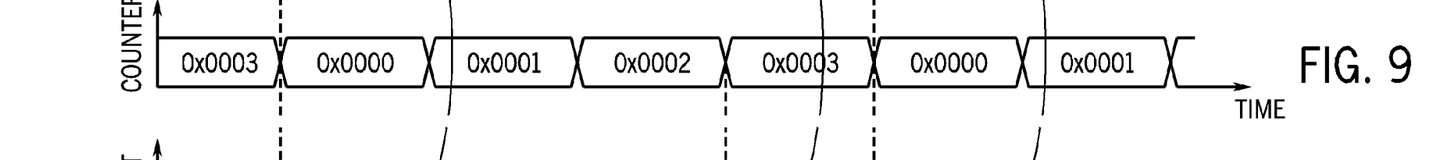
Figure 10:
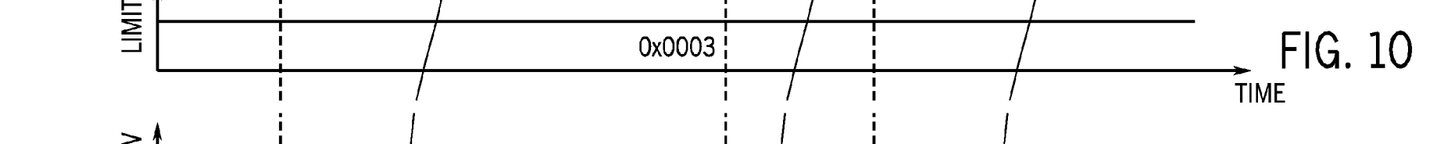
Figure 11:
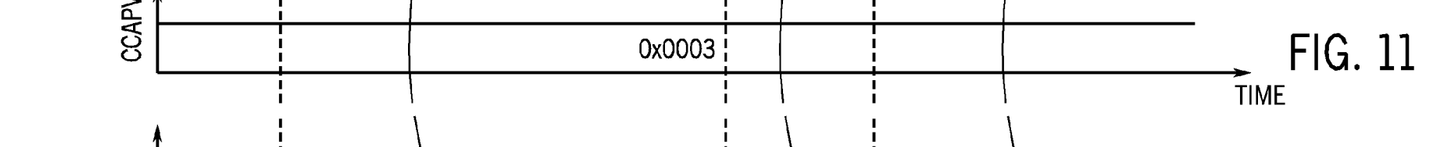
Figure 12:
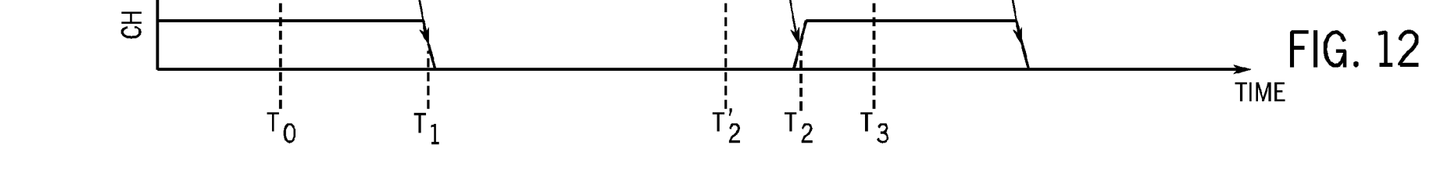

FIGS. 8-12 depict the generation of an exemplary center-aligned PWM waveform by the PCA 200, as illustrated by a channel signal (called "CH") of FIG. 12. For this example, the duration of the PWM cycle (from time $T_0$ to time $T_3$) is established by a LIMIT value of "3." Moreover, the duty cycle of the PWM waveform is controlled by the CCAPV value of "3" for this example. Due to the LIMIT value of 3, the COUNTER signal cycles from an initial value of zero to a final value of 3 before re-initializing back to the zero value to begin another cycle. Therefore, as depicted in FIG. 9, beginning at time $T_0$, the COUNTER signal has a value of "0," and at time $T_3$ (at the end of the cycle), the COUNTER signal transitions from a value of "3" back to a value of "0." As further described below, the counter of the PCA 200 is clocked by a clock signal called "COUNT_EN" (see FIG. 8). In this manner, in accordance with an exemplary embodiment, the value indicated by the COUNTER signal changes to indicate new count values in synchronization with positive going, or rising, edges 256 of the COUNT_EN signal on each cycle 250 of the COUNT_EN signal.

As can be seen from Equations 1 and 2, when the CCAPV value is an even number, the beginning and end times for the on time pulses are whole numbers, which correspond to whole cycles (i.e., given rising edges 256) of the COUNT_EN signal. However, when the CCAPV value is an odd number, the beginning and end times are fractional numbers. To accommodate odd CCAPV values, the PCA 200 (in accordance with an exemplary embodiment) selectively adds a half cycle of the COUNT_EN signal to the off time of the center-aligned PWM waveform, depending on whether the CCAPV value is odd or even.

As a more specific example, in an exemplary embodiment, the PCA 200 synchronizes, or aligns, the beginning and end times of the on pulses with the rising edges 256 of the COUNT_EN signal when the corresponding CCAPV value is an even number. When, however, the CCAPV value is an odd number, the PCA 200 adds a half cycle of the COUNT_EN signal to the off time by synchronizing, or aligning, either the beginning or end time (depending on the particular embodiment) with a negative going, or falling, edge 258 of the COUNT_EN signal. For the specific example that is depicted in FIGS. 8-12, due to the CCAPV value being "3," an odd number, the PCA 200 synchronizes the beginning time of the on time pulse with a falling edge 258a of the COUNT_EN signal, as depicted at time $T_2$. Therefore, although at time $T_2'$ the value indicated by the COUNTER signal is "2," which is greater than the time set forth in Eq. 2, the PCA 200 does not assert the CH signal in synchronization with the corresponding rising edge 256b of the COUNT_EN signal. Instead, the PCA 200 adds an additional half cycle of the COUNT_EN signal to the off time by beginning the on time pulse at time $T_2$, which corresponds to the subsequent falling edge 258a of the COUNT_EN signal. By controlling the generation of the PWM waveform in the above-described manner, the PCA 200 is capable of generating signal changes on half cycles of the counter frequency rather than synthesizing another clock or using a higher frequency clock signal.

Figure 13:
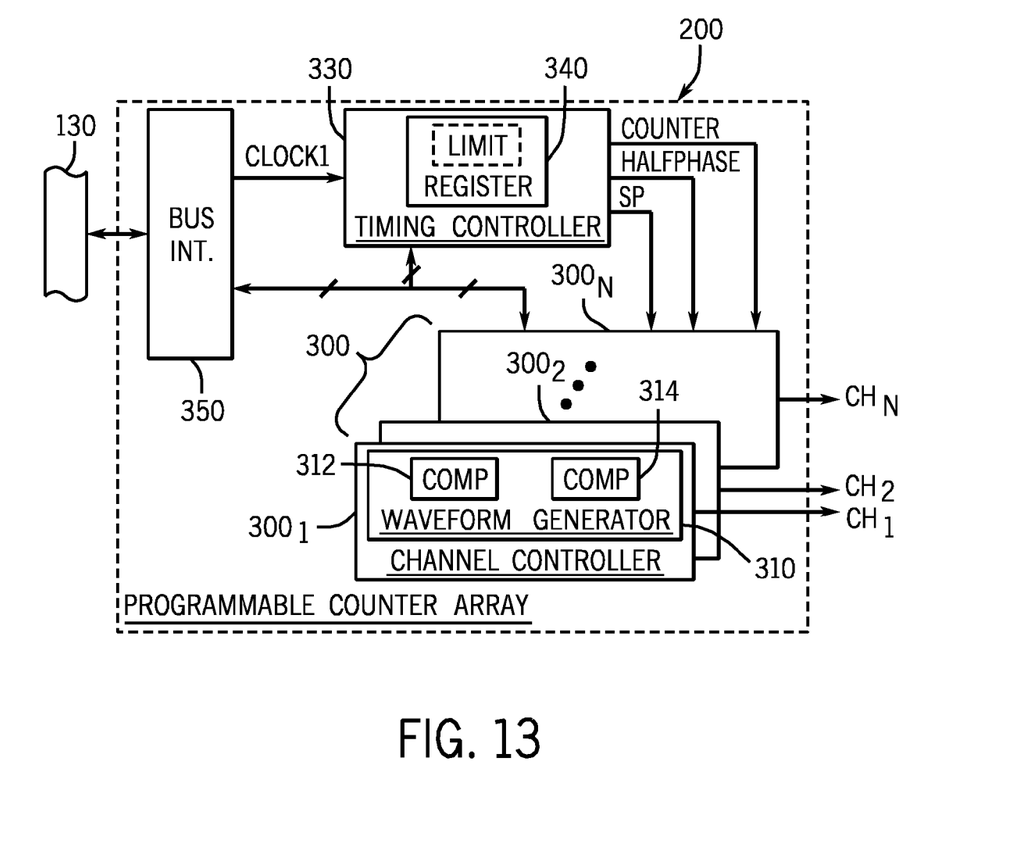
FIG. 13 is a schematic diagram of the programmable counter array of FIG. 2 according to an exemplary embodiment.

Referring to FIG. 13, in accordance with an exemplary embodiment, the PCA 200 includes a timing controller 330, which generates the COUNTER signal that is received and used by channel controllers 300 (channel controllers $300_1$, $300_2$ ... $300_N$, being depicted in FIG. 13, as non-limiting examples) to generate respective channel signals (channel signals $CH_1$, $CH_2$ ... $CH_N$, being depicted as non-limiting examples) for their corresponding channels. In accordance with some embodiments, the timing controller 330 does not provide a counter clock signal to the channels controllers 300. Instead, the timing controller 330 provides a logical construct for a clock signal, using the COUNTER signal and additional signals called "HALFPHASE" and "SP," which establish a timing (when appropriate) for adding a half cycle of the COUNT_EN signal to the off time of a given PWM waveform. In this manner, the timing controller 330 asserts the HALFPHASE signal coincident with the negative going edge of the COUNT_EN signal (see FIGS. 8-12, for example); and the timing controller 330 asserts the SP signal during the second phase of the COUNT_EN signal.

In general, each channel controller 300 includes a waveform generator 310, which includes comparators 312 and 314 for purposes of generating the waveforms for its particular channel, as further described below. It is noted that the CH signals may be single-ended or differential signals, depending on the particular embodiment.

In accordance with some embodiments, to generate a center-aligned PWM signal, the waveform generator 310 compares the counter value indicated by the COUNTER signal to programmable values stored in the waveform generator 310, which correspond to the end (Eq. 1) and beginning (Eq. 2) times. In this manner, in accordance with some embodiments, the waveform generator's comparator 312 compares a value derived from Eq. 1 with the value indicated by the COUNTER signal for purposes of determining when the counter value surpasses the end time. Upon such occurrence, the waveform generator 310 begins the off interval. The comparator 314 of the waveform generator 310, in turn, compares the value indicated by the COUNTER signal to the value of Eq. 2. In this manner, when the value indicated by the COUNTER signal exceeds the begin time, the waveform generator 310 ends the off time and begins another on time pulse.

In accordance with some embodiments, the timing of when the on time pulse begins depends on whether the CCAPV value is odd or even and further depends on the states of the HALFPHASE and SP signals. As a non-limiting example, the timing controller 330 asserts (drives to a logic one level, as a non-limiting example) the SP signal to indicate when the counter (i.e., when the COUNT_EN clock signal) is in the second half of its cycle. Conversely, in the first half of the cycle, the timing controller 330 de-asserts (drives to a logic zero level) the SP signal. The timing controller 330 asserts the HALFPHASE signal (drives the HALFPHASE signal to a logic one level, for example) to cause the waveform generator 310 to add the half cycle. As a non-limiting example, in accordance with some embodiments, when the HALFPHASE signal is asserted and the waveform generator 310 determines that the CCAPV value is an odd number, then the waveform generator 310 begins the next on time pulse at the next falling edge of the COUNT_EN signal, even though the comparator 314 had previously indicated (coinciding with the proceeding rising edge of the COUNT_EN signal when the counter value changed) that the count value exceed the value stored in the comparator 314.

Among its other features, in accordance with some embodiments, the PCA 200 includes a bus interface 350, which is coupled to the system bus 130 (see FIG. 2, for example), for purposes of permitting the PCA 200 to be programmed to select the particular mode of operation of the array 200, program the LIMIT value, program the CCAPV values where appropriate for the corresponding channels, as well as set other configuration parameters of the PCA 200. The timing controller 330 receives a CLOCK1 signal, which may be a generally relatively higher frequency system bus clock signal (a clock signal from the system bus 130, for example) than the frequency of the COUNT_EN signal. The timing controller 330 effectively divides the CLOCK1 in frequency for purposes of generating the COUNT_EN signal, i.e., for purposes of controlling the frequency at which the COUNTER signal is updated.

Figure 14:
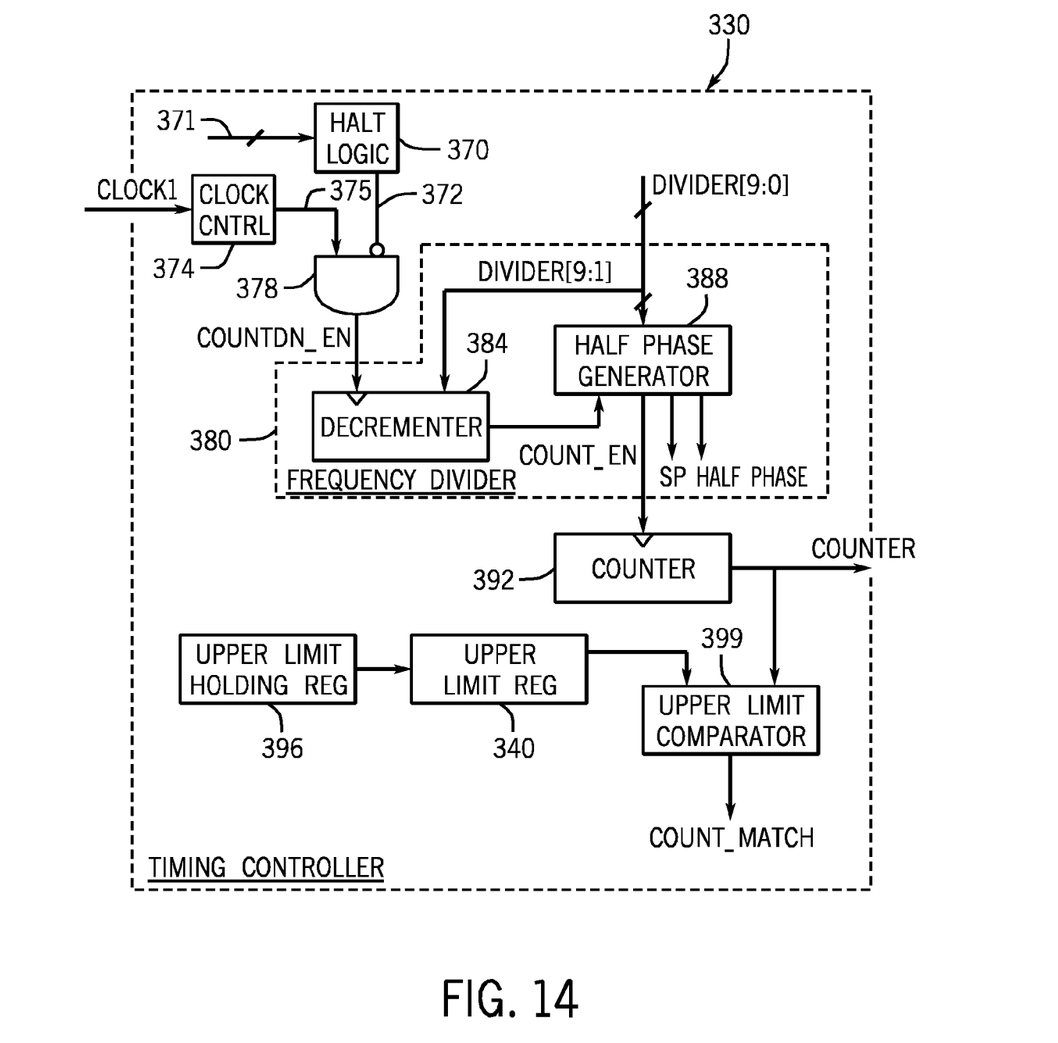
FIG. 14 is a schematic diagram of a timing controller of the programmable counter array of FIG. 13 according to an exemplary embodiment.

Referring to FIG. 14, more specifically, in accordance with some embodiments, the timing controller 330 includes a counter 392 that is clocked by the COUNT_EN signal for purposes of generating the COUNTER signal at output terminals of the counter 392. The timing controller 330 further includes a frequency divider 380, which generates the COUNT_EN, COUNTER, SP and HALFPHASE signals in response to the CLOCK1 signal. In this regard, the CLOCK1 signal is communicated to the frequency divider 380, and the frequency divider 380 receives a gated version of the CLOCK1 signal (called the "COUNTDN_EN signal" herein), as controlled by a clock controller 374. In this manner, depending on the particular programmable configuration of the clock controller 370, the COUNTDN_EN signal is the CLOCK1 signal or a selected gated version of the CLOCK1 signal. It is noted that, depending on the particular embodiment, the COUNTDN_EN signal may be a frequency-divided version of the CLOCK1 signal or may have the same frequency as the CLOCK1 signal.

The COUNT_EN signal, and thus, the operation of the PCA 200 in general, may be temporally suspended by halt logic 370 that that has an output terminal 372 that is coupled to an inverting input terminal of an AND gate 378. An output terminal 375 of the clock controller 374 is coupled to a non-inverting input terminal of the AND gate 378. As its name implies, the halt logic 370 permits various events (via input terminals 371 of the halt logic 370) to temporarily suspend the COUNT_EN signal and thus, temporarily suspend updating of the COUNTER signal by the timing controller 330.

In accordance with some embodiments, the frequency divider 380 includes a down counter, or decrementer 384, which is clocked by the COUNTDN_EN signal. In general, the decrementer 384 is used by the frequency divider 380 to divide by a divisor P through a process in which the decrementer 384 counts down twice during a given cycle of the COUNT_EN signal. In this regard, the divisor P is established by a multi-bit signal called "DIVIDER[9:0]," and the decrementer 384 receives all but least significant bit (LSB) of the DIVIDER[9:0] signal, i.e., receives the DIVIDER[9:1] signal. In other words, the decrementer 384 counts down a value of P/2. For a given cycle of the COUNT_EN signal, the decrementer 384 first counts down by P/2 during the first half, or phase, of the cycle; and the decrementer 384 reloads with the P/2 value again to count down for the second phase of the cycle. A halfphase generator 388 controls the loading of the decrementer 384 and generates the SP and HALFPHASE signals accordingly. Moreover, the halfphase generator 388 correspondingly generates the COUNT_EN signal, i.e., generates the falling edge of the COUNT_EN signal to coincide with the decrementer 384 reaching a zero count during the first phase of the cycle and generates the rising edge of the COUNT_EN signal to coincide with the decrementer 384 reaching a zero count during the second phase of the cycle.

Among its other features, in accordance with some embodiments, the timing controller 330 includes an upper limit comparator 399, which monitors the COUNTER signal for purposes of determining when the COUNTER signal reaches the LIMIT value, which is stored in the register 340. In accordance with some embodiments, upon detecting that the COUNTER signal has reached the LIMIT value, the upper limit comparator 399 asserts (drives to a logic one value, for example) a signal called "COUNT_MATCH." The assertion of the COUNT_MATCH signal resets to the value of the counter 392 to zero, in accordance with some embodiments.

As also depicted in FIG. 14, the timer controller 330 may include an upper limit holding register 396, which initially receives data indicative of a program value for the LIMIT value and transfers this value into the upper limit register 340 to update the LIMIT value during at the appropriate time.

Note that in various embodiments, the time controller 330 and other circuitry described herein may use other numbers of signals, other signal levels, etc., as desired.

Figure 15:
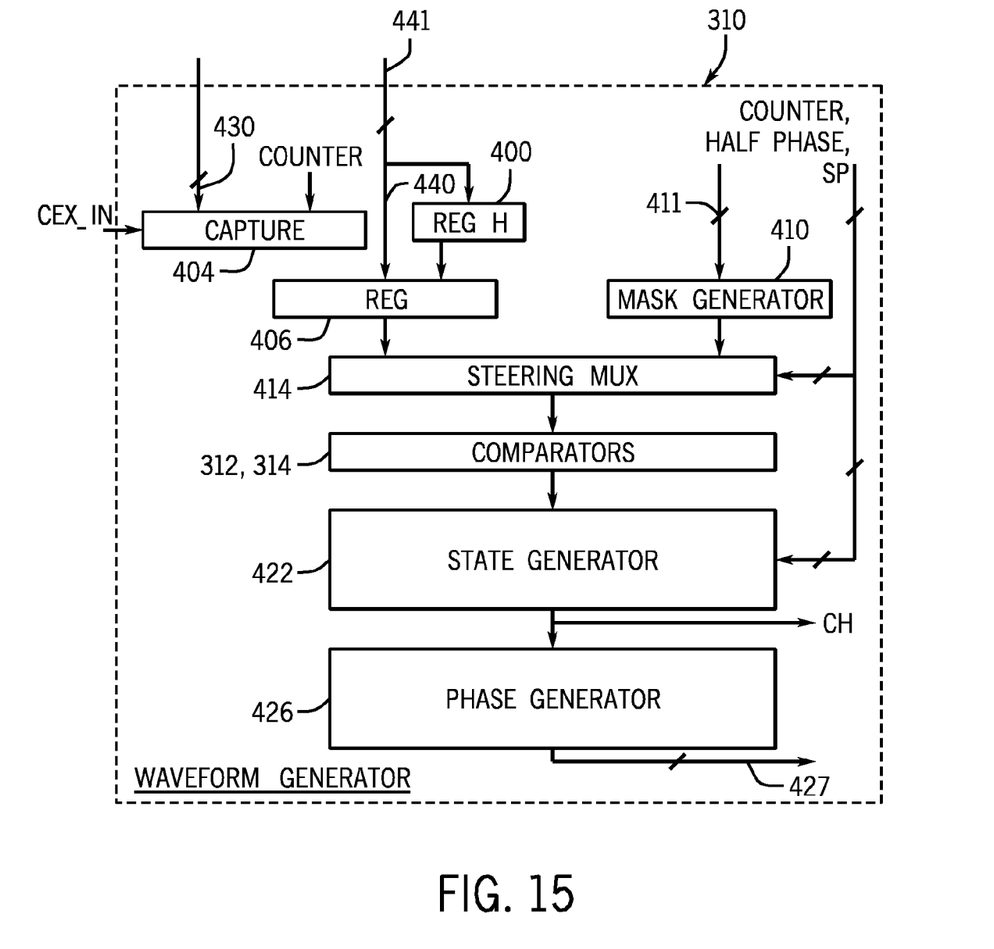
FIG. 15 is a schematic diagram of a waveform generator for a channel of the programmable counter array of FIG. 13 according to an exemplary embodiment.

Referring to FIG. 15, in accordance with some embodiments, the waveform generator 310 includes a register 406 that receives programmed data indicative of the CCAPV value. As also depicted in FIG. 15, the waveform generator 310 may further include a holding register 400 for purposes of temporarily storing this data to permit proper timing of its introduction. The waveform generator 310 includes a mask generator 410, which, in general, receives programmed configuration signals to select the particular mode of operation for the waveform generator 310. The mask generator 410 controls steering multiplexers 414 appropriately to control the values that are compared by the comparators 312 and 314; the use of the particular comparators; the operands that are used; the mode of operation of the waveform generator 310 (i.e., whether the generator 310 operates in the edge-aligned PWM mode; an n-bit edge-aligned PWM mode; a center-aligned PWM mode; a square wave mode (a mode in which the channel signal swings negative or a mode in which the channel signal does not swing negative, depending on the particular implementation); a timer/capture mode or a software timer mode); and so forth. Other and different modes of operation are contemplated and are within the scope of the appended claims.

In accordance with some embodiments, a single comparator 312 may be used by the waveform generator 310 for five of the six modes, with the center-aligned PWM mode of operation employing the use of both comparators 312 and 314. A state generator 422 of the waveform generator 310 uses the comparators 418 for purposes of determining when to assert and de-assert the channel CH signal. Thus, as set forth above, during the center-aligned PWM mode of operation, the state generator 422 uses the comparator 312 for purposes of determining the ending time for the on pulse and controlling the CH signal accordingly; and the state generator 422 uses the comparator 314 for purposes of determining the beginning time for the on pulse and controlling the state of the CH signal accordingly.

Among its other features, in accordance with some embodiments, the waveform generator 310 includes a phase generator 426, which generates generally complimentary signals, which may be used for motor control applications and which includes appropriate dead times that may be set by corresponding programmable settings. The waveform generator 310 may further include capture logic 404, which is configured via configuration lines 430 and receives an external input signal (called "CEX_IN signal" in FIG. 15), which is monitored by the capture logic 404 in the capture mode of operation for purposes of detecting states of the CEX_IN signal.

Figure 16:
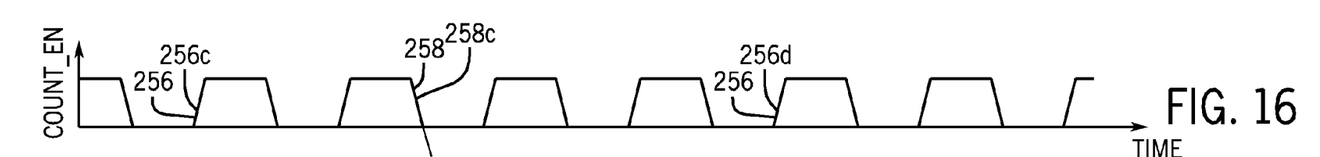
FIGS. 16-20 depict exemplary signals used by the programmable counter array of FIG. 13 to generate an edge-aligned pulse width modulation signal according to an exemplary embodiment.
Figure 17:
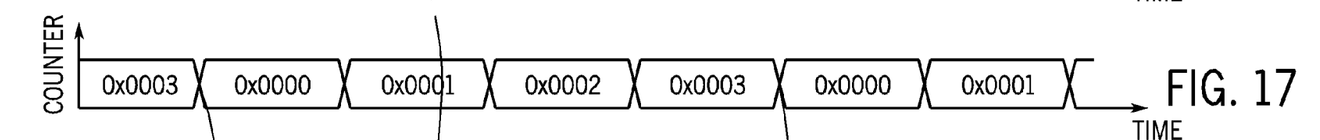
Figure 18:
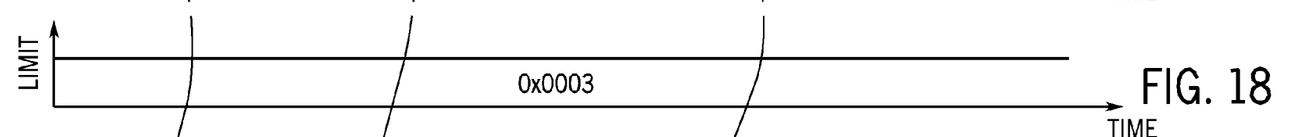
Figure 19:
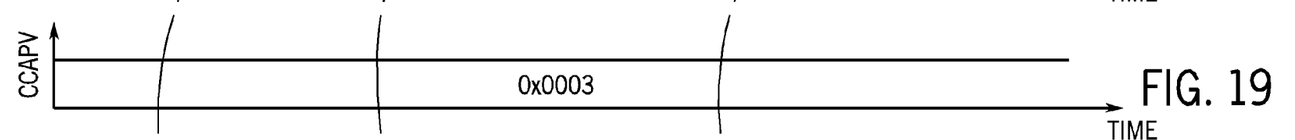
Figure 20:
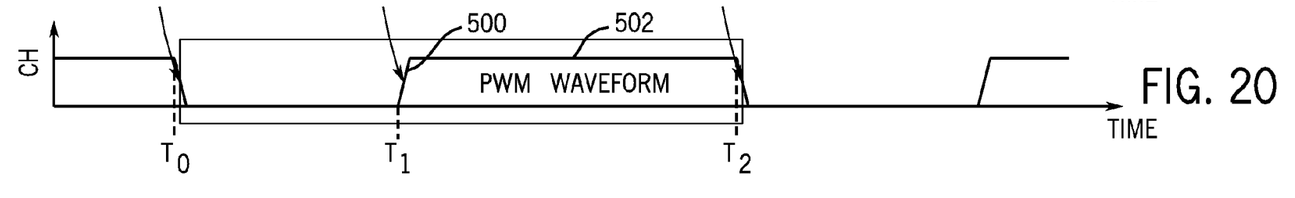

In accordance with some embodiments, the PCA 200 may also use the above-described half cycle control for purposes of generating PWM waveforms, other than center-aligned PWM waveforms. In this regard, as a non-limiting example, in accordance with some embodiments, during an edge-aligned PWM mode, the waveform generator 310 may use a single comparator 312 for purposes of comparing the count value to an appropriate value derived from the CCAPV value for purposes of determining when to begin the on time of a particular edge aligned PWM waveform. As a more specific example, FIG. 16 (depicting the COUNT_EN signal), FIG. 17 (depicting the COUNTER signal), FIG. 18 (depicting the LIMIT value), FIG. 19 (depicting the CCAPV value) and FIG. 20 (depicting the CH signal) depict an example for which the LIMIT value is 3 and the CCAPV value is "3" for an edge-aligned PWM waveform. Due to the alignment of the off time of the PWM waveform with leading edge of the cycle, the PWM waveform begins in synchronization with a corresponding rising edge 256c of the COUNT_EN signal and ends with another rising edge 256b of the COUNT_EN signal, as set by the duration established by the LIMIT value. The waveform generator, in turn, determines the appropriate time to begin the on time pulse for the PWM waveform, which is time $T_1$. In general, the waveform generator 310 compares the counter value to the (CCAPV/2) value to determine when to begin the on time pulse. However, as depicted in this example, when the CCAPV value is odd (such as 3, here), the waveform generator 310 delays the beginning of the on time pulse by a half cycle, i.e., begins the on time pulse at time $T_1$ in synchronization, or alignment with, the falling edge 258c of the COUNT_EN signal.

While a limited number of embodiments have been disclosed herein, those skilled in the art, having the benefit of this disclosure, will appreciate numerous modifications and variations therefrom. It is intended that the appended claims cover all such modifications and variations.

What is claimed is:
1. A method comprising:
using a first signal produced by a counter to generate a center-aligned pulse width modulation signal having a first time profile;
using the first signal to concurrently generate a pulse width modulation signal having a second time profile different from the first time profile; and
using the first signal to generate at least one additional signal having a third time profile different from the first and second time profiles.

2. The method of claim 1, wherein
using the first signal to generate the first center-aligned pulse width modulation signal comprises using the first signal to generate a center-aligned pulse width modulation signal having a first duty cycle; and
using the first signal to generate a second pulse width modulation signal comprises using the first signal to generate a second pulse width modulation signal that is center-aligned relative to the first center-aligned pulse width modulation signal and has a second duty cycle different from the first duty cycle.

3. The method of claim 1, wherein using the first signal to generate the at least one additional signal comprises using the first signal to generate an edge-aligned pulse width modulation signal.

4. The method of claim 1, further comprising:
frequency dividing a first clock signal to generate a second clock signal;
clocking a counter with the second clock signal to generate the first signal; and
generating a phase signal identifying a phase of the second clock signal,
wherein using the first signal to generate the center-aligned pulse width modulation signal comprises generating the center-aligned pulse width modulation signal based at least in part on the phase signal and the first signal.

5. The method of claim 4, wherein using the first signal to generate the center-aligned pulse width modulation signal further comprises selectively adding a fractional period of the second clock signal to a pulse width of the center-aligned pulse width modulation signal based at least in part on the phase signal and a determination of whether a programmable pulse width value indicative of a corresponding number of cycles of the first signal is even or odd.

6. The method of claim 1, wherein using the first signal to generate the first center-aligned pulse width modulation signal comprises:
comparing a value indicated by the first signal to a value indicative of a first time boundary of a pulse width of the center-aligned pulse width modulation signal;
comparing the value indicated by the first signal to a value indicative of a second time boundary of the pulse width of the center-aligned pulse width modulation signal; and
generating the center-aligned pulse width modulation signal based at least in part on the comparisons to the first and second time boundaries.

7. An apparatus comprising:
a counter to generate a first signal;
a first waveform generator to use the first signal to generate a center-aligned pulse width modulation signal having a first duty cycle; and
a second waveform generator to use the first signal to concurrently generate another pulse width modulation signal having a second duty cycle different from the first duty cycle.

8. The apparatus of claim 7, wherein the another pulse width modulation signal comprises another center-aligned pulse width modulation signal.

9. The apparatus of claim 7, further comprising:
a frequency divider to divide a frequency of a first clock signal to generate a second clock signal to clock the counter; and
a phase identification circuit to generate a phase signal identifying a phase of the second clock signal,
wherein the first waveform generator is adapted to generate the center-aligned pulse width modulation signal based at least in part on the phase signal and the first signal.

10. The apparatus of claim 9, wherein the first waveform generator is further adapted to selectively add a fractional period of the second clock signal to a pulse width of the center-aligned pulse width modulation signal based at least in part on the phase signal and whether a programmable pulse width value indicative of a number of cycles of the first signal is even or odd.

11. The apparatus of claim 7, wherein the first waveform generator comprises:
a first comparator to compare a value indicative of the first signal to a value indicative of a first time boundary of a pulse width of the center-aligned pulse width modulation signal; and
a second comparator to compare the value indicative of the first signal to a value indicative of a second time boundary of the pulse width of the center-aligned pulse width modulation signal,
wherein the second waveform generator is further adapted to generate the center-aligned pulse width modulation signal based at least in part on signals provided by the first and second comparators.

12. An apparatus comprising:
an integrated circuit comprising a programmable counter array and a processor to program the programmable counter array, wherein the programmable counter array is adapted to generate a first signal indicative of a count, the programmable counter array comprising:
a first waveform generator to use the first signal to generate a center-aligned pulse width modulation signal having a first duty cycle; and
a second waveform generator to use the first signal to concurrently generate another pulse width modulation signal having a second duty cycle different from the first duty cycle.

13. The apparatus of claim 12, wherein the another pulse width modulation signal comprises another center-aligned pulse width modulation signal.

14. The apparatus of claim 12, further comprising at least one additional waveform generator to generate at least one additional signal having a third time profile different from the first and second time profiles.

15. The apparatus of claim 14, wherein the at least one additional waveform generator comprises a waveform generator adapted to generate an edge-aligned pulse width modulation signal.

16. The apparatus of claim 12, wherein the programmable counter array further comprises:
a phase identification circuit to generate a phase signal identifying a phase of a clock signal of the programmable counter array,
wherein the first waveform generator is adapted to generate the center-aligned pulse width modulation signal based at least in part on the phase signal and the first signal.

17. The apparatus of claim 16, wherein the first waveform generator is further adapted to selectively add a fractional period of the second clock signal to a pulse width of the center-aligned pulse width modulation signal based at least in part on the phase signal and whether a programmable pulse width value indicative of a number of cycles of the clock signal is even or odd.

18. The apparatus of claim 12, wherein the first waveform generator comprises:
a first comparator to compare a value indicative of the first signal to a value indicative of a first time boundary of a pulse width of the center-aligned pulse width modulation signal; and a second comparator to compare a value indicative of the first signal to a value indicative of a second time boundary of the pulse width of the center-aligned pulse width modulation signal, wherein the first waveform generator is further adapted to generate the center-aligned pulse width modulation signal based at least in part on signals provided by the first and second comparators.

19. The apparatus of claim 12, wherein the programmable counter array comprises at least one register to be programmed with data to define the first and second time profiles.

\* \* \* \* \*